United States Patent [19]

Buck et al.

[11] 4,336,491

[45] Jun. 22, 1982

[54] ELECTRONIC MONITORING SYSTEM STABILIZED AGAINST ACCIDENTAL TRIGGERING

[75] Inventors: Robert Buck, Neukirch; Ingo S. Ozech, Friedrichshafen, both of Fed. Rep. of Germany

[73] Assignee: i f m electronic GmbH, Essen, Fed. Rep. of Germany

[21] Appl. No.: 232,186

[22] Filed: Feb. 6, 1981

[30] Foreign Application Priority Data

Feb. 9, 1980 [DE] Fed. Rep. of Germany ....... 3004829

[51] Int. Cl.³ ............................................. H01H 36/00
[52] U.S. Cl. ................................... 323/326; 323/316; 328/5; 307/308
[58] Field of Search ........ 323/288, 242, 243, 315–317, 323/324–326, 904; 361/179–181; 328/5; 307/252 J, 252 N, 252 P, 308; 330/257, 288; 331/65, 117 R

[56] References Cited

U.S. PATENT DOCUMENTS

| 3,621,373 | 11/1971 | Mitchell et al. | 323/243 X |
| 3,909,625 | 9/1975 | Colglazier et al. | 328/5 X |
| 3,979,610 | 9/1976 | Gordon | 323/315 X |
| 3,984,757 | 10/1976 | Gott et al. | 323/326 |
| 4,138,709 | 2/1979 | Colwill | 328/5 X |

FOREIGN PATENT DOCUMENTS 2203906  6/1977  Fed. Rep. of Germany.

Primary Examiner—William M. Shoop
Assistant Examiner—Peter S. Wong
Attorney, Agent, or Firm—Karl F. Ross

[57] ABSTRACT

A contactless motion detector, including an oscillator sensitive to an approaching metallic element, includes an electronic switch such as a thyristor triggerable by an output signal from a demodulator comprising a storage capacitor which is alternately chargeable and dischargeable, preferably with constant current, during each cycle of a high-frequency voltage generated by the oscillator. The oscillator voltage is compared with a reference voltage by means of a differential amplifier causing the flow of a charging current into the capacitor when the oscillator voltage exceeds the reference voltage whereas a discharging current flows out of that capacitor in the opposite case. The reference voltage is so chosen that the capacitor charge rises in the course of a few cycles above a predetermined threshold when the oscillator voltage is high but remains below that threshold when it is low.

10 Claims, 4 Drawing Figures

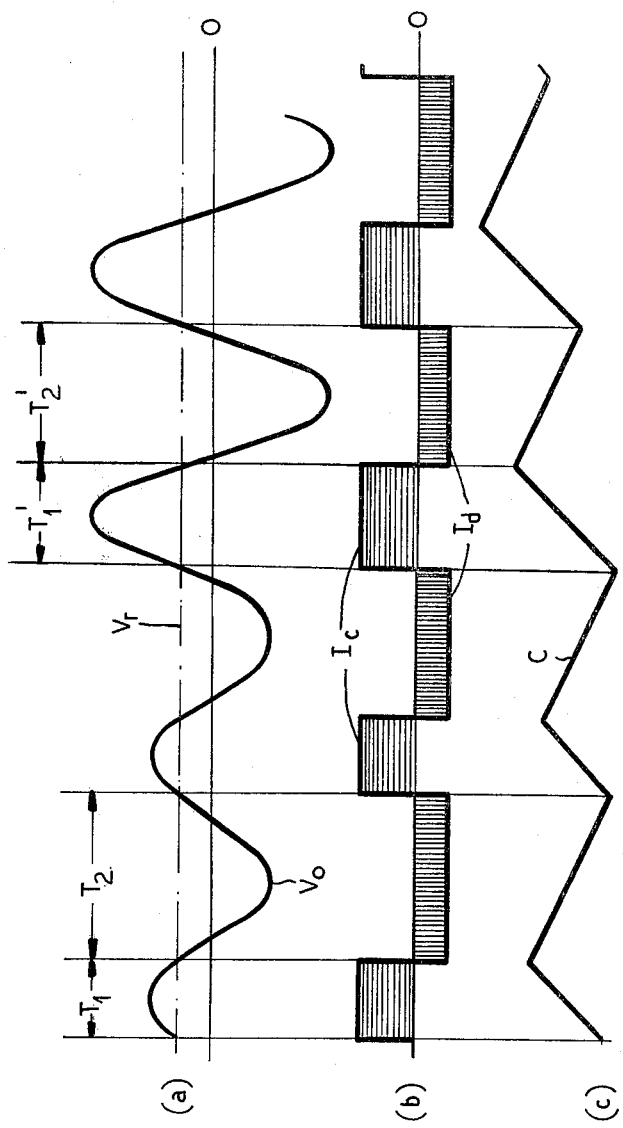

ELECTRONIC MONITORING SYSTEM STABILIZED AGAINST ACCIDENTAL TRIGGERING

FIELD OF THE INVENTION

Our present invention relates to an electronic monitoring system, as used for example in a proximity sensor, wherein an oscillator forming part of a preferably contactless detector, sensitive to an ambient condition, significantly increases the amplitude of a substantially sinusoidal voltage wave generated thereby upon a predetermined change in that condition, e.g. upon the approach or the departure of a metallic element.

BACKGROUND OF THE INVENTION

Such a monitoring system has been described, for example, in U.S. Pat. No. 4,193,023 to Robert Buck and Gerd Marhofer, as well as in various earlier patents cited therein. Conventionally, e.g. as disclosed in U.S. Pat. No. 3,747,010, the oscillator output is rectified and intergrated by a blocking condenser and a bypass diode in the input of a transistor inserted in a charging path of a storage capacitor which is shunted by a relatively high-ohmic discharge resistance so as to accumulate a charge of a maginitude depending on the oscillator amplitude. When that charge reaches a certain level, an electronic switch such as a thyristor is triggered to energize a load for signaling the occurrence of the event to be monitored.

While this type of monitoring system operates generally satisfactorily, it may still be susceptible to an untimely triggering of its electronic switch by externally induced transient voltages charging the storage capacitor above the critical level. This is due to the fact that the charging path of the storage capacitor has a relatively short time constant, in comparison with that of its discharging path, whereby even a small number of rapidly recurring spurious pulses in the transistor input will cause a significant charge increase.

OBJECT OF THE INVENTION

The object of our present invention, therefore, is to provide an improved monitoring system of this type which is stabilized against accidental triggering.

SUMMARY OF THE INVENTION

We realize this object, in accordance with our present invention, by providing comparison means such as a differential amplifier connected on the one hand to the oscillator and on the other hand to a source of reference voltage for producing a control pulse during a fraction of each cyle of the substantially sinusoidal voltage wave generated by that oscillator, this control pulse lasting as long as the amplitude of the voltage wave surpasses the reference voltage. Either a charging path or a discharging path (preferably the former) for a storage capacitor is established in the presence of a control pulse by circuit means responsive to the comparison means; when the capacitor charge attains a predetermined value, a thyristor or equivalent electronic switch is triggered as known per se from the patents cited above.

Thus, the storage capacitor is charged and discharged during certain periods of each oscillator cycle whose relative lengths vary with amplitude so that the net result is either an increase or a decrease in its voltage, depending on the ratio of these periods and on the respective rates of current flow. With suitable choice of these flow rates and of the reference voltage, therefore, the capacitor will attain its trigger level after a few cycles following a changeover in the oscillator amplitude. Especially with an elevated operating frequency, the number of cycles needed for this purpose may be large enough to avoid triggering by even a succession of spurious voltage pulses without unduly delaying the response of the system to the monitored event.

Advantageously, pursuant to a more particular feature of our invention, a coupling network forming part of the aforementioned circuit means passes charging and discharging currents in a substantially invariable ratio. If the differential amplifier is effective only in alternate (e.g. positive) half-cycles of the voltage wave, and if charging occurs during those periods in which the absolute value of the oscillator voltage exceeds that of the reference voltage, the ratio of charging time to discharging time can never be less than 1:1; in that case, therefore, the magnitude of the charging current should exceed that of the discharging current, with a preferred current ratio of about 2:1.

We prefer, accordingly, to design the coupling network as a bidirectional constant-current unit alternately connecting the storage capacitor to a current source for charging and to a current sink for discharging. Such a unit may comprise two sections coupled to respective branches of the differential amplifier, advantageously via a pair of current mirrors as more fully described hereinafter.

BRIEF DESCRIPTION OF THE DRAWING

The above and other features of our invention will now be described in detail with reference to the accompanying drawing in which:

FIG. 4 is a set of graphs relating to the operation of the circuitry of FIG. 3.

SPECIFIC DESCRIPTION

Figure 1:
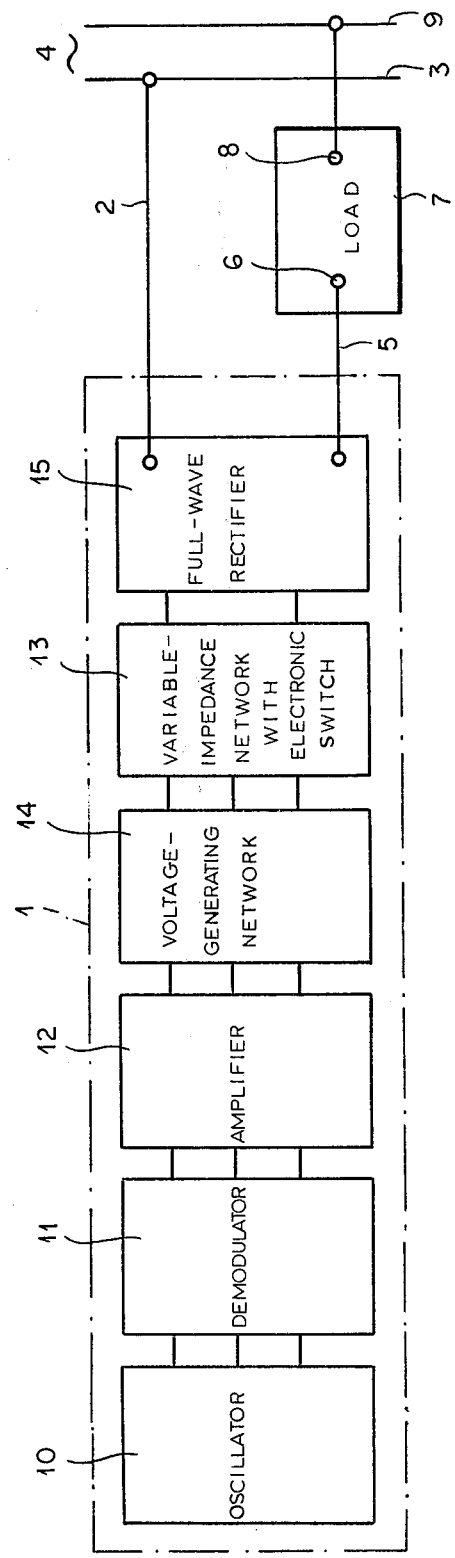
FIG. 1 is a block diagram of an electronic monitoring system embodying our invention.

FIG. 1 shows the basic components of a monitoring system according to our invention, namely an oscillator 10 generating a high-frequency sinusoidal voltage, a demodulator 11 emitting a trigger signal in response to a significant change in the amplitude of that voltage, an amplifier 12 receiving that trigger signal for feeding it to an electronic switch in a variable-impedance network 13, a voltage-generating network 14 interposed between amplifier 12 and switching network 13, and a full-wave rectifier 15 inserted between network 13 and a load 7 such as a relay having a terminal 6 connected by a lead 5 to one terminal of that rectifier and having a terminal 8 tied to a grounded conductor 9 of an a-c supply 4 whose live conductor 3 is joined to the other rectifier terminal by a lead 2. The rectifier 15 feeds direct current to components 13 and 14 via a negative bus 41 and a positive bus 42. Positive operating voltage for components 10 and 12 is emitted by network 14 on an auxiliary bus 42'; the output voltage of oscillator 10 is delivered by a lead 21 to the modulator 11 from which a trigger signal is transmitted on a lead 43 to amplifier 12 and thence on an extension 43' thereof to networks 13 and 14.

Figure 2:
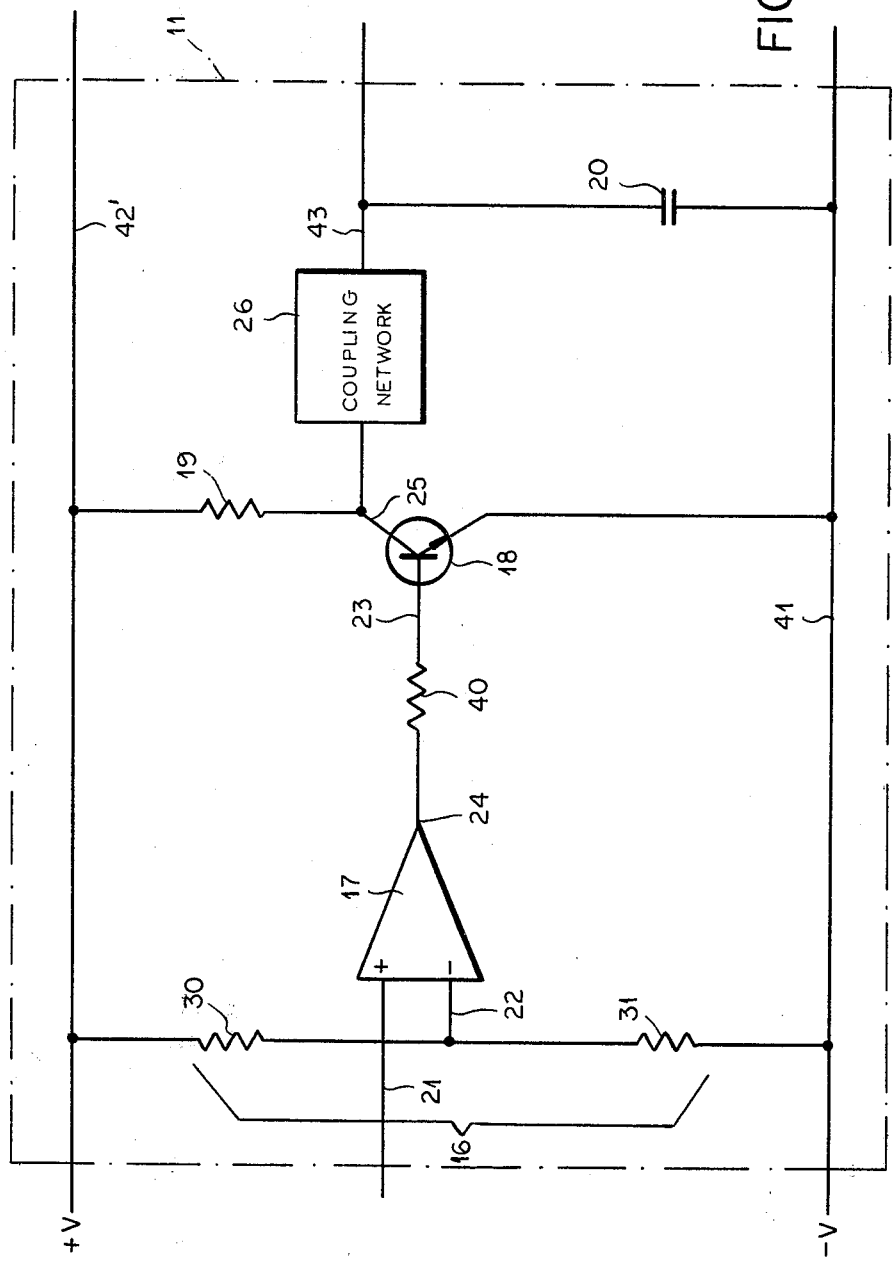
FIG. 2 is a more detailed diagram of a demodulating stage or trigger circuit forming part of the system of FIG. 1.

In FIG. 2 we have shown the demodulator stage 11 as comprising a differential amplifier 17 with an additive input connected to the oscillator output 21 and with a subtractive input 22 tied to a tap on a voltage divider 16 consisting of two resistors 30 and 31 which are serially connected across buses 41 and 42' carrying a negative supply voltage $-V$ and an auxiliary positive voltage $+V$. Amplifier 17 has an output lead 24 connected through a resistor 40 to a base lead 23 of an NPN switching transistor 18 whose emitter is joined to negative bus 41. The collector lead 25 of transistor 18 is connected by way of a resistor 19 to positive bus 42' and is further connected through a coupling network 26 to an output lead 43 and thus to a storage capacitor 20 inserted between that lead and negative bus 41. Network 26 may consist of passive impedances allowing current to flow in either direction therethrough to charge the capacitor 20 via resistor 19 when transistor 18 is cut off and to discharge that capacitor when the transistor is saturated. The switchover between cutoff and saturation occurs when a positive-going voltage on lead 21 begins to exceed the reference potential on lead 22.

The combination of a differential amplifier and a switching transistor is known per se from German Pat. No. 2,203,906 granted June 2, 1977 to Robert Buck. In that instance, however, the transistor has a hysteresis outlasting a cycle of the oscillator output so as to integrate the voltage swing emitted by the differential amplifier. In the present case, on the other hand, transistor 18 follows faithfully the voltage changes on lead 24 so that capacitor 20 is alternately charged and discharged during each cycle.

Figure 3:
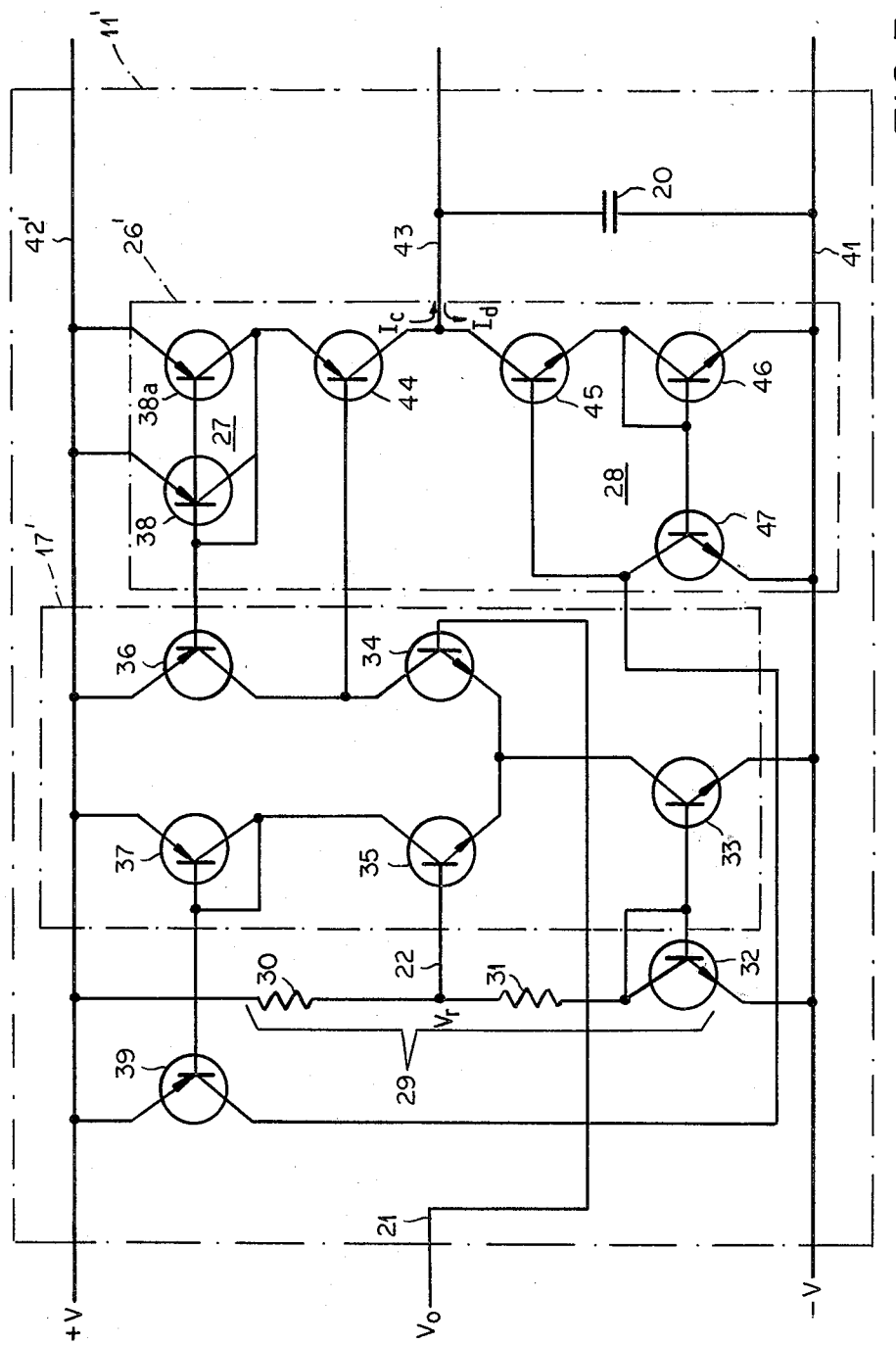
FIG. 3 shows details of a modified demodulating stage according to our invention.

In FIG. 3 we have shown a modified demodulator or trigger circuit 11' with a differential amplifier 17' controlling a coupling network 26' without interposition of a switching transistor. Network 26' is a constant-current unit with a first section 27 inserted between positive bus 42' and lead 43 and with a second section 28 inserted between lead 43 and negative bus 41. Amplifier 17' comprises a first branch, including an NPN input transistor 34 in series with a PNP output transistor 36, and a second branch, including a NPN input transistor 35 in series with a PNP output transistor 37. The bases of transistors 34 and 35 are connected to leads 21 and 22, respectively. Amplifier 17' further comprises a main transistor 33 of NPN type connected in series with both branches, as an emitter resistance of input transistors 34 and 35, between bushes 41 and 42' so as to be traversed by the combined current of these branches.

A voltage divider 29, including the two series resistors 30 and 31 whose junction is tied to base lead 22, further comprises an NPN compensating transistor 32 connected as a diode and forming a current mirror with amplifier transistor 33 whereby fluctuations in the auxiliary supply voltage $+V$ leave the emitter/base voltage of transistor 35 virtually unchanged.

A similar current-mirror relationship exists between output transistor 36 of differential amplifier 17' and twin PNP transistors 38, 38a which together with a PNP transistor 44 in series therewith constitute the constant-current section 27 of network 26'. The constant-current section 28 of that network comprises three NPN transistors 45, 46, 47 as well as a PNP transistor 39 which forms a current mirror with output transistor 37 of amplifier 17'. PNP transistor 36, 37, 38, 38a and 39 all have their emitters tied to positive bus 42'. Transistor 44, whose emitter is joined to the collectors of twin transistor 38 and 38a, has its base connected to the output lead 24 of amplifier 17' extending from the collector of transistors 34 and 36. The interconnected collectors of transistors 44 and 45 are tied to lead 43 and thus to one of the plates of capacitor 20 whose other plate is joined to negative bus 41 as in FIG. 2. The base of transistor 45 is connected to the collectors of transistors 39 and 47 while its emitter is joined to the collector of transistor 46 as well as to the bases of transistors 46 and 47 which form a further current mirror and have their emitters tied to negative bus 41.

The operation of the demodulator 11' will now be described with reference to FIG. 4 where graph (a) shows the sinusoidal voltage wave $V_o$ emitted on lead 21 by the oscillator 10 of FIG. 1, graph (b) shows charging and discharging currents $I_c$ and $I_d$ alternately passing through network sections 27 and 28, and graph (c) shows the resulting charging voltage C on capacitor 20 and lead 43. In the left-hand part of FIG. 4 the oscillator voltage $V_o$ has a small amplitude which surpasses a reference voltage $V_r$, applied by voltage divider 29 to lead 22, only during a minor fraction $T_1$ of a cycle. The charging current $I_c$ flowing during this period $T_1$ through network section 27 has twice the magnitude of the discharging current $I_d$ which traverses the network section 28 during the remaining period $T_2$ of a cycle; since, however, $T_2 > 2T_1$, the net result is a decrease in the capacitor charge C. When, however, the oscillator voltage $V_o$ increases as shown in the right-hand part of FIG. 4, e.g. upon detection of an approaching metallic element, the charging period $T_1'$ becomes greater than half the discharging period $T_2'$ so that the voltage C across capacitor 20 begins to increase until it reaches the level necessary to trigger the electronic switch of network 13.

The doubling of the charging current $I_c$ relative to the discharging current $I_d$ is achieved by the simultaneous conduction of the parallel twin transistors 38 and 38a (connected as diodes) when transistor 44 is turned on by the active amplifier branch 34,36, as against only one such transistor 46 conducting together with transistor 45 when the other amplifier branch 35, 37, is active. Such doubling would not be necessary if a full-wave rectifier (without smoothing condenser) were inserted in lead 21 so that voltage $V_o$ would have two positive peaks in each cycle.

The constant-current unit 26' could also be used in lieu of the passive coupling network 26 in the demodulator 11 of FIG. 2, e.g. with connection of collector lead 25 to the bases of transistors 44 and 45 (transistors 39 and 47 being omitted in that instance).

The various current mirrors shown in FIG. 3 could be conveniently realized with integrated circuitry.

We claim:
1. An electronic monitoring system comprising:
   detector means sensitive to an ambient condition, including an oscillator emitting a periodically varying voltage wave whose amplitude significantly increases upon a predetermined change in said condition;
   comparison means connected to said oscillator and to a source of reference voltage for producing a control pulse during a fraction of each cycle of said voltage wave as long as said amplitude surpasses said reference voltage;

a storage capacitor provided with circuit means for alternately establishing a charging path and a discharging path therefor, said circuit means being responsive to said comparison means for establishing one of said paths in the presence and the other of said paths in the absence of said control pulse; and electronic switch means triggerable by said storage capacitor for energizing a load upon the charge of said capacitor attaining a predetermined value indicative of said change in said condition.

2. A system as defined in claim 1 wherein said circuit means includes a coupling network passing charging and discharging currents in a substantially invariable ratio.

3. A system as defined in claim 2 wherein said comparison means is effective only in alternate half-cycles of said voltage wave, said ratio being substantially 2:1.

4. A system as defined in claim 2 or 3 wherein said comparison means comprises a differential amplifier, said coupling network being inserted between said storage capacitor and said differential amplifier.

5. A system as defined in claim 4 further comprising a switching transistor with a base connected to an output of said differential amplifier and with a collector connected to said coupling network.

6. A system as defined in claim 4 wherein said coupling network comprises a first constant-current section inserted between said storage capacitor and a current source and further comprises a second constant-current section inserted between said trigger capacitor and a current sink, said differential amplifier having first and second branches respectively coupled to said first and second constant-current sections.

7. A system as defined in claim 6 wherein said branches include respective output transistors, said constant-current sections including other transistors forming respective current mirrors with said output transistors.

8. A system as defined in claim 7 wherein said branches further include respective input transistors in series with said output transistors, one of said input transistors having a control electrode connected to said oscillator, the other of said input transistors having a control electrode connected to said source of reference voltage.

9. A system as defined in claim 8 wherein said source of reference voltage comprises a resistive voltage divider connected across a pair of supply conductors feeding direct current to said oscillator, the control electrode of said other of said input transistors being connected to a tap of said voltage divider.

10. A system as defined in claim 9 wherein said differential amplifier further includes a main transistor in series with both said branches, said main transistor forming a current mirror with a compensating transistor in series with said voltage divider.

* * * * *